United States Patent
Magdefrau et al.

(10) Patent No.: US 12,410,107 B2
(45) Date of Patent: Sep. 9, 2025

(54) NANOLAMINATE FIBER INTERFACE COATINGS FOR COMPOSITES

(71) Applicant: RTX Corporation, Farmington, CT (US)

(72) Inventors: Neal Magdefrau, Tolland, CT (US); Paul Sheedy, Bolton, CT (US)

(73) Assignee: RTX CORPORATION, Farmington, CT (US)

( * ) Notice: Subject to any disclaimer, the term of this patent is extended or adjusted under 35 U.S.C. 154(b) by 0 days.

(21) Appl. No.: 15/958,119

(22) Filed: Apr. 20, 2018

(65) Prior Publication Data

US 2019/0322595 A1 Oct. 24, 2019

(51) Int. Cl.
- *C04B 41/45* (2006.01)
- *C04B 35/76* (2006.01)
- *C04B 35/82* (2006.01)
- *C04B 41/52* (2006.01)

(52) U.S. Cl.
CPC .......... *C04B 41/4584* (2013.01); *C04B 35/76* (2013.01); *C04B 35/82* (2013.01); *C04B 41/52* (2013.01); *C04B 2235/5212* (2013.01); *C04B 2235/5216* (2013.01); *C04B 2237/704* (2013.01)

(58) Field of Classification Search
None
See application file for complete search history.

(56) References Cited

U.S. PATENT DOCUMENTS

| | | | |
|---|---|---|---|
| 5,593,728 A | 1/1997 | Moore et al. | |
| 5,948,541 A * | 9/1999 | Inspektor | C23C 28/00 407/119 |
| 6,322,889 B1 | 11/2001 | Lara-Curzio et al. | |
| 6,979,490 B2 | 12/2005 | Steffier | |
| 7,871,944 B2 | 1/2011 | Sanders et al. | |
| 8,524,317 B2 | 9/2013 | Flandermeyer et al. | |
| 9,732,005 B2 | 8/2017 | Magdefrau et al. | |
| 9,764,989 B2 | 9/2017 | Chamberlain et al. | |
| 2004/0138046 A1 | 7/2004 | Sherwood, Jr. et al. | |
| 2005/0181192 A1 * | 8/2005 | Steffier | B32B 18/00 428/293.4 |
| 2014/0272373 A1 * | 9/2014 | Chamberlain | C04B 35/806 428/293.4 |
| 2015/0004393 A1 | 1/2015 | Pegna et al. | |
| 2015/0291473 A1 | 10/2015 | Schmidt | |

(Continued)

FOREIGN PATENT DOCUMENTS

| EP | 0459938 A1 * | 12/1991 |
|---|---|---|
| EP | 3514125 A1 | 7/2019 |

(Continued)

OTHER PUBLICATIONS

English translation of Zhao et al. (CN 107073877) (Year: 2017).*

(Continued)

*Primary Examiner* — Ronak C Patel

(74) *Attorney, Agent, or Firm* — CANTOR COLBURN LLP

(57) ABSTRACT

Disclosed is a multi nanolayer interface coating for a fiber of a composite including a first interface coating nanolayer deposited onto the fiber of the ceramic matrix composite, and a second interface coating nanolayer deposited onto the first interface coating nanolayer.

6 Claims, 1 Drawing Sheet

(56) References Cited

U.S. PATENT DOCUMENTS

| | | | |
|---|---|---|---|
| 2016/0107940 A1* | 4/2016 | Lazur | C04B 35/591 |
| | | | 427/249.2 |
| 2016/0264475 A1 | 9/2016 | Sheedy et al. | |
| 2017/0089205 A1* | 3/2017 | Joshi | F01D 5/186 |
| 2017/0254463 A1* | 9/2017 | Apicella | F16L 21/002 |

FOREIGN PATENT DOCUMENTS

| | | |
|---|---|---|
| GB | 2467928 A | 8/2010 |
| WO | 2014197036 A1 | 12/2014 |

OTHER PUBLICATIONS

English translation of Schulman et al. (JP 11116422) (Year: 1999).*
English translation of De Weerd et al. CN 107405797 (Year: 2017).*
Amit K Roy et al: "Oxidation protection of carbon fibers by coating with alumina and/or titania using atomic layer deposition", Carbon, Elsevier, Oxford, GB, vol. 50, No. 3, Sep. 12, 2011, pp. 761-770.
European Search Report for European Application No. 19169280.5 dated Aug. 28, 2019, 9 pages.
Communication pursuant to Article 94(3) issued in European Patent Application No. 19169280.5 on Dec. 20, 2021, 6 pages.

* cited by examiner

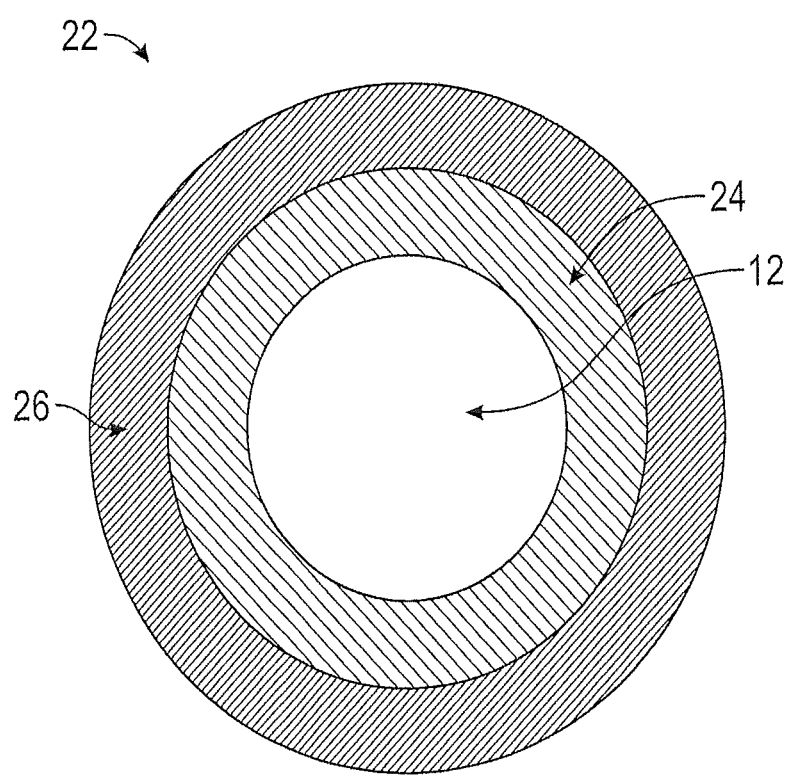

NANOLAMINATE FIBER INTERFACE COATINGS FOR COMPOSITES

BACKGROUND

Exemplary embodiments pertain to the art of composites, including ceramic matrix composites.

Composite components are finding increased use into aerospace applications due to their unique, tailorable properties which can result in significant weight savings, increased performance and durability, as well as reductions in specific fuel consumption. In particular, gas turbine engines, such as aircraft engines, operate in severe environments and show significant benefit from incorporation of composite materials. Additionally, other aerospace components, such as brakes, can benefit from incorporating composite materials.

As an example, ceramic matrix composite (CMC) components have desirable high temperature mechanical, physical, and chemical properties which allow gas turbine engines to operate at much higher temperatures with significant weight savings as compared to current engines with superalloy components. As opposed to traditional, monolithic ceramics, CMCs exhibit a significant amount of damage tolerance when under an applied load. This damage tolerance is due in part to the formation of multiple matrix cracks that aid in the redistribution of stresses to the high strength fibers.

The formation of matrix cracks may result in environmental exposure to the fiber and fiber interface coating. As CMCs, along with many other composites, are used under harsh environmental conditions improved interface coatings are desired.

BRIEF DESCRIPTION

Disclosed is a multi nanolayer interface coating for a fiber of a composite material including a first interface coating nanolayer deposited onto the fiber of the composite, and a second interface coating nanolayer deposited onto the first interface coating nanolayer.

In addition to one or more of the features described above, or as an alternative to any of the foregoing embodiments, the first interface coating nanolayer has a thickness of 0.5 Angstroms to less than 25 nanometers. Additionally, in some embodiments, the second interface coating nanolayer has a thickness of 0.5 Angstroms to less than 25 nanometers.

In some embodiments, the multi nanolayer interface coating for the fiber of the composite includes a third interface coating nanolayer deposited onto the second interface coating nanolayer, and a fourth interface coating nanolayer deposited onto the third interface coating nanolayer.

In some embodiments, the multi nanolayer interface coating for the fiber of the composite includes a plurality of nanolayers having a combined thickness less than or equal to 5000 nanometers. The plurality of nanolayers may be arranged in a pattern with symmetric, asymmetric, periodic and non-periodic patterns contemplated. In some embodiments the pattern is an alternating pattern.

In addition to one or more of the features described above, or as an alternative to any of the foregoing embodiments, the composite may be a ceramic or glass matrix composite. In addition to one or more of the features described above, or as an alternative to any of the foregoing embodiments, the composite may be a metal matrix composite. In addition to one or more of the features described above, or as an alternative to any of the foregoing embodiments, the composite may be a polymer matrix composite.

Also disclosed is a composite material including a matrix material and a plurality of fibers embedded within the matrix material. The plurality of fibers includes a multi nanolayer interface coating. The multi nanolayer interface coating includes a first interface coating nanolayer deposited onto the plurality of fibers, and a second interface coating nanolayer deposited onto the first interface coating nanolayer.

In addition to one or more of the features described above, or as an alternative to any of the foregoing embodiments, the first interface coating nanolayer has a thickness of 0.5 Angstroms to less than 25 nanometers. Additionally, in some embodiments, the second interface coating nanolayer has a thickness of 0.5 Angstroms to less than 25 nanometers.

In addition to one or more of the features described above, or as an alternative to any of the foregoing embodiments, the multi nanolayer interface coating for the fiber of the composite includes a third interface nanolayer coating deposited onto the second interface coating nanolayer, and a fourth interface nanolayer coating deposited onto the third interface nanolayer coating.

In addition to one or more of the features described above, or as an alternative to any of the foregoing embodiments, the multi nanolayer interface coating for the fiber of the composite includes a plurality of nanolayers having a combined thickness less than or equal to 5000 nanometers. The plurality of nanolayers may be arranged in an alternating pattern.

In addition to one or more of the features described above, or as an alternative to any of the foregoing embodiments, the composite may be a ceramic or glass matrix composite. In addition to one or more of the features described above, or as an alternative to any of the foregoing embodiments, the composite may be a metal matrix composite. In addition to one or more of the features described above, or as an alternative to any of the foregoing embodiments, the composite may be a polymer matrix composite.

Also disclosed is a method for depositing a multi nanolayer interface coating onto a fiber of a composite including depositing a first interface coating nanolayer onto the fiber by atomic layer deposition, and depositing a second interface coating nanolayer onto the first interface coating nanolayer by atomic layer deposition.

In addition to one or more of the features described above, or as an alternative to any of the foregoing embodiments, the method further includes depositing a third interface coating nanolayer onto the second interface coating nanolayer, and depositing a fourth interface coating nanolayer onto the third interface coating nanolayer.

BRIEF DESCRIPTION OF THE DRAWINGS

The following descriptions should not be considered limiting in any way. With reference to the accompanying drawings, like elements are numbered alike:

The FIGURE is a cross-sectional diagram of a multi nanolayer interface coating for fibers of composites.

DETAILED DESCRIPTION

A detailed description of one or more embodiments of the disclosed apparatus and method are presented herein by way of exemplification and not limitation with reference to the FIGURE.

Composites, as used herein, refer to reinforcing materials dispersed in a matrix. Exemplary matrices include ceramics, glasses, metals, polymers, and combinations thereof. Exemplary ceramic and glass matrices may include: SiC, SiCO, SiCNO, SiBCN, $Si_3N_4$, carbides such as boron carbide, carbon, aluminum oxide, mullite, zirconium oxide, borosilicate glasses, aluminosilicate glasses, high silica glasses, phosphate glasses, and combinations thereof. Exemplary metal matrices may include: nickel-based alloys, iron alloys, cobalt alloys, aluminum alloys, refractory metal alloys such as tungsten and molybdenum alloys, and combinations thereof. Exemplary polymer matrices may include thermoset and thermoplastic polymers. Thermoset matrices may include bis-malemide, cyanate esters, epoxies, phenolics, polyesters, polyimides, polyurethanes, silicones, vinyl esters and mixtures thereof. Thermoplastic matrices may include but are not limited to polyetherimides, polyamide imides, polyphenylene sulfides, polycarbonates and polyetheretherketones.

Composites exhibit a significant amount of damage tolerance when under an applied load. In ceramic matrix composites (CMC) in particular, this damage tolerance is due to the formation of multiple matrix cracks that aid in the redistribution of stresses. However, the formation of matrix cracks can result in environmental exposure to the fiber and fiber interface coating. The fiber interface coating protects the fiber from the environmental exposure and provides a weak interface to allow for composite behavior.

The multi nanolayer interface coating described herein provides a weak interface with the fiber to allow for composite behavior and can be tailored to provide the necessary environmental protection. The multiple nanolayers can prevent crack propagation from reaching the fibers and the use of atomic layer deposition to form the nanolayers results in improved compositional and dimensional control of the nanolayers, such as less oxygen being present in the nanolayers themselves. The multiple nanolayer structure of the interface coating also impedes penetration of environmental oxygen into the inner nanolayer or nanolayers of the coating and provides better protection to the fiber. The oxygen penetration and the presence of oxygen in the nanolayers can lead to degradation of the nanolayers themselves and/or cause fiber degradation. Additionally, the multi nanolayer interface coating may be tailored to influence other properties of the composite, including, friction and wear properties, thermal and radiative heat transfer properties, heat capacity, as well as other thermal, material, and mechanical properties.

Referring now to the FIGURE, a coated fiber for use in a composite is shown. The coated fiber includes a fiber 12 and a multi nanolayer interface coating 22. In the illustrative embodiment, the fiber 12 contains silicon and carbon and is embodied as a silicon carbide fiber. In some embodiments, the fiber 12 may comprise aluminum oxide, mullite, aluminosilicate zirconium oxide, yttrium aluminum garnet, SiC, SiCO, SiCNO, SiBCN, $Si_3N_4$, a carbide such as boron carbide, carbon, and combinations thereof. In some embodiments, the fiber 12 may be embodied as one or more of a CG Nicalon fiber, a Hi-Nicalon fiber, a Hi-Nicalon Type S fiber, a Sylramic fiber, a Sylramic iBN fiber, a Tyranno ZMI fiber, a Tyranno SA fiber, a Tyranno SA3 fiber, and any other type of carbon-based or carbide fibers. The phase(s) of the fibers may be stoichiometric or non-stoichiometric. In addition, the fibers may be fully crystalline, fully amorphous or partially crystalline and partially amorphous. In some embodiments, the multi nanolayer interface coating 22 may be applied to fibers used in fiber reinforced composites.

As illustratively shown in the FIGURE, the multi nanolayer interface coating 22 includes two coating nanolayers 24, 26. It should be appreciated that the multi nanolayer interface coating 22 may include more coating nanolayers. For example, the multi nanolayer interface coating 22 may include a total number of coating nanolayers ranging anywhere from two (2) nanolayers to two hundred (200) nanolayers. Additionally, the total number of nanolayers may depend on the individual nanolayer thickness and fiber type.

The individual thickness of each nanolayer may vary. For example, the individual thickness of each nanolayer may range from 0.5 Angstroms to less than 25 nanometers nanometers. The thickness of the adjacent nanolayers varies by less than an order of magnitude. For example, if the first nanolayer has a thickness of 1 nanometer, the second nanolayer has a thickness of 10 nanometers or less. The layers may be arranged in any pattern or may be arranged without a pattern. The pattern may be symmetric, periodic, or non-periodic pattern. In some embodiments the nanolayers are arranged in an alternating pattern. As used herein an alternating pattern is defined as two or more subunits arranged in a consistent repeating pattern such as ABABAB, ABCABCABC, ABCBABCBA, or the like.

The nanolayers may comprise a nitride, carbide, boride, or oxide. Exemplary nitrides, carbides, and borides include boron nitride, titanium nitride, aluminum nitride, silicon nitride, zirconium nitride, hafnium nitride, tantalum nitride, niobium nitride, aluminum carbide, silicon carbide, zirconium carbide, titanium carbide, hafnium carbide, tantalum carbide, niobium carbide, boron carbide, titanium diboride, zirconium diboride, and hafnium diboride. Exemplary oxides include oxides of aluminum, silicon, titanium, vanadium, chromium, iron, cobalt, nickel, zinc, magnesium, calcium, strontium, barium, hafnium, zirconium, niobium, tantalum, the rare earths, tungsten, molybdenum, and combinations thereof. In some instances, the nanolayers may comprise a metal, including, but not limited to boron, silicon, aluminum, iron, cobalt, magnesium, yttrium, titanium, chromium, tungsten, molybdenum, nickel, and platinum.

The nanolayers are deposited by atomic layer deposition (ALD). ALD allows the deposition of nanolayers having a thickness of 0.5 angstroms up to the desired thickness. ALD also provides an opportunity to dope the nanolayers with additional materials to introduce desirable properties. For example, boron nitride can be doped with silicon to improve environmental resistance to oxidation and pesting.

It should be appreciated that the nanolayers may be deposited onto a single multifilament tow or on fabrics that include multiple multifilament tows. Additionally, in some embodiments, the nanolayers may be deposited onto fiber, single multifilament fiber tow, and/or fabrics that include multiple multifilament fiber tows at deposition temperatures from ambient or room temperature to 1400° C., or 100° C. to 800° C., or 250° C. to 500° C. Fabrics may be woven or non-woven. Alternatively, the alternating nanolayers may be deposited at any other temperature and/or temperature range suitable for nanolayer deposition. For example, in some embodiments, the deposition temperature may be determined based at least in part on, or otherwise as a function of, the precursor chemistries, composite type, fiber type, and/or the desired crystalline content.

It should be appreciated that in embodiments such as the one illustratively shown in the FIGURE, the multi nanolayer interface coating may reduce environmental degradation or otherwise increase the environmental stability of the fiber in CMC materials where matrix cracking occurs. Specifically, in some embodiments, the nanolayers may reduce low temperature embrittlement and improve water vapor resistance. In some additional embodiments the nanolayer may be tailored to influence other properties of the composite, including, friction and wear properties, thermal and radiative heat transfer properties, heat capacity, as well as other thermal, material, and mechanical properties.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A multi nanolayer interface coating for a fiber of a composite comprising:
   a first interface coating nanolayer deposited onto the fiber of the composite, and
   a second interface coating nanolayer deposited onto the first interface coating nanolayer;
   a third interface coating nanolayer deposited onto the second interface coating nanolayer, and a fourth interface coating nanolayer deposited onto the third interface coating nanolayer;
   wherein the first, second, third and fourth interface coating nanolayers are arranged in a consistent repeating pattern; where the first, second, third and fourth interface coating nanolayers contain a nitride, a carbide, a boride, or an oxide; where the first, second, third and fourth interface coating nanolayers are disposed on the fiber via atomic layer deposition; and
   wherein the first interface coating nanolayer has the identical composition as the third interface coating nanolayer and the first interface coating nanolayer is deposited at the same deposition temperature as the third interface coating nanolayer, and the second interface coating nanolayer has the identical composition as the fourth interface coating nanolayer and the second interface coating nanolayer is deposited at the same deposition temperature as the fourth interface coating nanolayer, and the first interface coating nanolayer has a different composition than the second interface coating nanolayer, and the deposition temperature of the first interface coating nanolayer is different than the deposition temperature of the second interface coating nanolayer,
   wherein the thickness of the adjacent nanolayers varies by less than an order of magnitude,
   wherein the composite is a glass matrix composite, where the glass matrix composite is a borosilicate glass, an aluminosilicate glass, a high silica glass, a phosphate glass, or a combination thereof, wherein the first interface coating nanolayer has a thickness of 0.5 Angstroms to less than 25 nanometers, and wherein the second interface coating nanolayer has a thickness of 0.5 Angstroms to less than 25 nanometers.

2. The multi nanolayer interface coating of claim 1, wherein the multi nanolayer interface coating for the fiber of the composite comprises a plurality of nanolayers having a combined thickness less than or equal to 5000 nanometers.

3. The multi nanolayer interface coating of claim 2, wherein the plurality of nanolayers are arranged in a consistent repeating pattern.

4. A composite material comprising a matrix material and a plurality of fibers embedded within the matrix material wherein the plurality of fibers comprises a multi nanolayer interface coating and the multi nanolayer interface coating comprises a first interface coating nanolayer deposited onto the plurality of fibers, and a second interface nanolayer deposited onto the first interface coating nanolayer; and
   a third interface coating nanolayer deposited onto the second interface coating nanolayer, and a fourth interface coating nanolayer deposited onto the third interface coating nanolayer;
   wherein the first, second, third and fourth interface coating nanolayers are arranged in a consistent repeating pattern; and
   wherein the first interface coating nanolayer has the identical composition as the third interface coating nanolayer and the first interface coating nanolayer is deposited at the same deposition temperature as the third interface coating nanolayer, and the second interface coating nanolayer has the identical composition as the fourth interface coating nanolayer and the second interface coating nanolayer is deposited at the same deposition temperature as the fourth interface coating nanolayer, and the first interface coating nanolayer has a different composition than the second interface coating nanolayer, and the deposition temperature of the first interface coating nanolayer is different than the deposition temperature of the second interface coating nanolayer, where the first, second, third and fourth interface coating nanolayers contain a nitride, a carbide, a boride, or an oxide; where the first, second, third and fourth interface coating nanolayers are disposed on the fiber via atomic layer deposition;
   wherein the thickness of the adjacent nanolayers varies by less than an order of magnitude,
   wherein the composite is a glass matrix composite, where the glass matrix composite is a borosilicate glass, an aluminosilicate glass, a high silica glass, a phosphate glass, or a combination thereof, wherein the first interface coating nanolayer has a thickness of 0.5 Angstroms to less than 25 nanometers, and wherein the second interface coating nanolayer has a thickness of 0.5 Angstroms to less than 25 nanometers.

5. The composite material of claim 4, wherein the multi nanolayer interface coating for the fiber of the composite includes a plurality of nanolayers having a combined thickness less than or equal to 5000 nanometers.

6. The composite material of claim 5, wherein the plurality of nanolayers are arranged in a consistent repeating pattern.

* * * * *